United States Patent [19]

Chapek et al.

[11] Patent Number: 5,711,812
[45] Date of Patent: Jan. 27, 1998

[54] APPARATUS FOR OBTAINING DOSE UNIFORMITY IN PLASMA DOPING (PLAD) ION IMPLANTATION PROCESSES

[75] Inventors: David LeRoy Chapek, Boise, Id.; Susan Benjamin Felch, Los Altos, Calif.; Michael William Kissick; Shamim Muhammad Malik, both of Madison, Wis.; Tienyu Terry Sheng, San Jose, Calif.

[73] Assignee: Varian Associates, Inc., Palo Alto, Calif.

[21] Appl. No.: 469,401

[22] Filed: Jun. 6, 1995

[51] Int. Cl.⁶ .................................................. C23C 16/00
[52] U.S. Cl. ............................... 118/723 E; 204/298.06
[58] Field of Search ........................... 118/723 E, 723 I, 118/723 IR, 723 MP; 204/298.06, 298.34; 250/492.2

[56]        References Cited

U.S. PATENT DOCUMENTS

| | | | |
|---|---|---|---|
| 4,392,932 | 7/1983 | Harra | 204/192.32 |
| 4,999,096 | 3/1991 | Nihei et al. | 204/192.3 |
| 5,212,425 | 5/1993 | Goebel et al. | 315/111.21 |
| 5,289,010 | 2/1994 | Shohet | 250/492.21 |
| 5,330,800 | 7/1994 | Schumacher et al. | 427/523 |
| 5,354,381 | 10/1994 | Sheng | 118/723 |
| 5,449,411 | 9/1995 | Fukuda et al. | 118/723 MP |
| 5,558,718 | 9/1996 | Leung | 118/723 E |

OTHER PUBLICATIONS

Susan B. Felch et al., "Studies of Ultra-Shallow p+-n Junction Formation Using Plasma Doping", *Ion Implantation Technology*—94 (1995), pp. 981–984.

T. Sheng et al., "Characteristics of a Plasma Doping System For Semiconductor Device Fabrication", *Journal of Vacuum Science Technology* B 12(2), Mar./Apr. 1994, pp. 969–972.

Nathan W. Cheung, "Plasma Immersion Ion Implantation For ULSI Processing", *Nuclear Instruments and Methods in Physics Research* B55 (1991), pp. 811–820.

*Primary Examiner*—John Niebling
*Assistant Examiner*—Joni Y. Chang

[57]        ABSTRACT

An apparatus for improving dose uniformity in the PLAsma Doping (PLAD) ion implantation of a target material is described. By providing means for simultaneously biasing both the electrode, upon which the target is disposed, and a separately biasable concentric structure introduced about the electrode and sufficiently close to the target, together with means for adjustable bias variation between the electrode and the structure one can sufficiently adjust the shape of the implantation plasma, e.g. induced electric field and plasma sheath thickness, in order to effectively provide a uniform dose distribution during PLAD ion implantation processes.

8 Claims, 9 Drawing Sheets

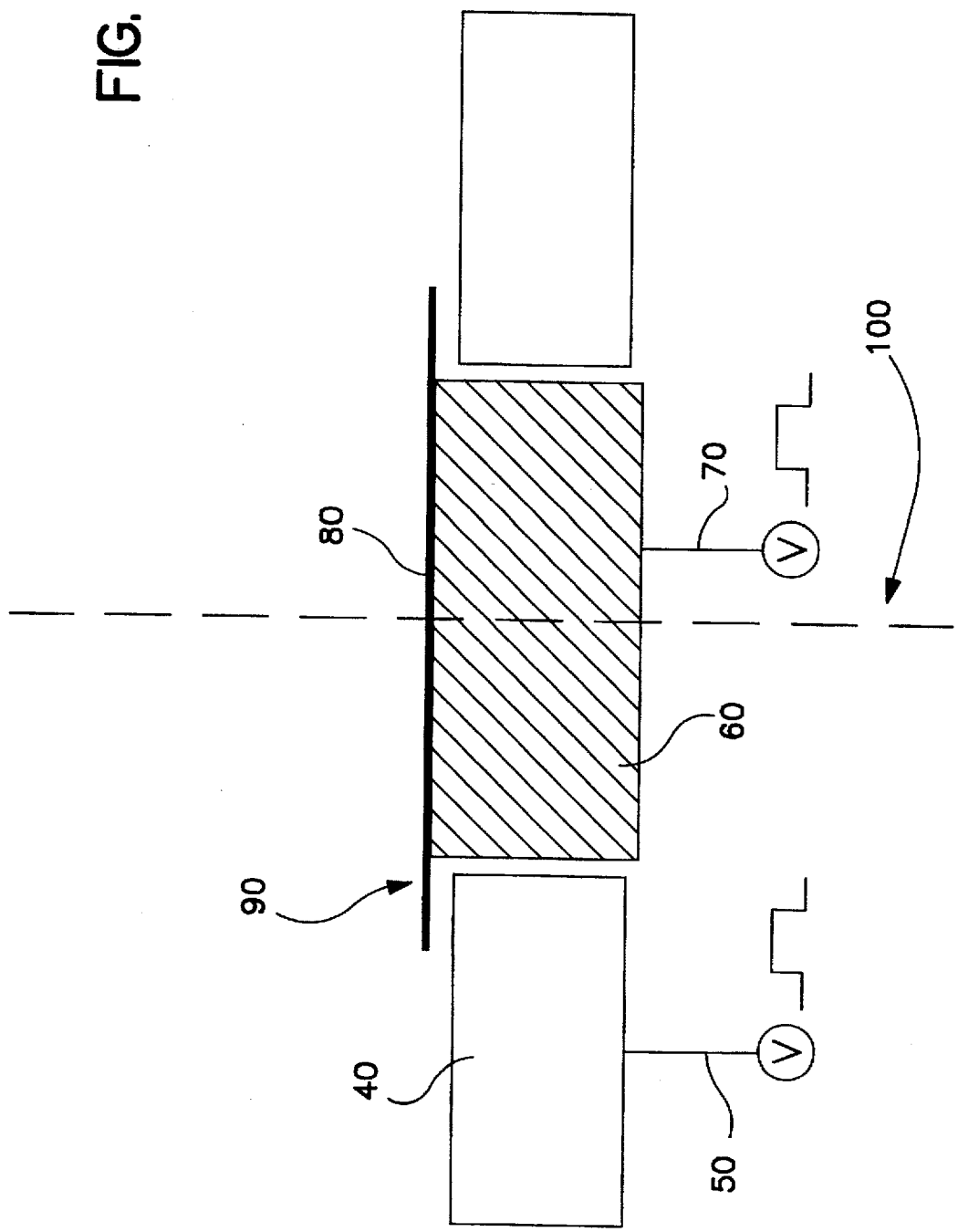

APPARATUS FOR OBTAINING DOSE UNIFORMITY IN PLASMA DOPING (PLAD) ION IMPLANTATION PROCESSES

FIELD OF THE INVENTION

This invention relates generally to an apparatus for doping of materials by ion implantation and more particularly to apparatus for obtaining dose uniformity in PLAsma Doping (PLAD) ion implantation processes. Dopant dose uniformity is preferrably accomplished by introducing some means for adjusting the shape of the electric field lines and the sheath thickness across the cathode.

RELATED INVENTIONS

The invention described herein relates to U.S. Pat. Nos. 5,354,381 filed May 7, 1993 to Sheng entitled "Plasma Immersion Ion Implantation ($PI^3$) Apparatus" as well as "Plasma Immersion Ion Implantation ($PI^3$) Method" U.S. Ser. No. 08/697,321 a division thereof, both of which are assigned to the same assignee as the present application and are incorporated herein by reference.

BACKGROUND OF THE INVENTION $PI^3$ is a technique for doping materials where the material itself is placed directly in the plasma source while applying an accelerating bias (of the order of a few kV) to the material. This is an attractive alternative to conventional ion implantation techniques as high dose rates (in the range of $10^{15}/cm^2$ min) can be achieved at lower energies with less cost intensive ion implantation equipment modification. Typically the target to be implanted is placed directly in the plasma and then biased to a negative potential in order to sufficiently accelerate positive ions into the target for implantation.

Cold Cathode Plasma Immersion Ion Implantation ($C^2PI^3$) a version of PLAsma Doping (PLAD) uses a negative pulse on the order of kilovolts applied to an electrode. This pulsed bias creates sufficient electric field to electrically break down a gas which contains the desired dopant into a plasma. A target intended to be doped with the ion species contained in the plasma is placed on the surface of the electrode. Together the electrode and target form the cathode of the system. Upon application of sufficient negative bias, the cathode forms a plasma whereupon electrons are repelled away from the cathode and positively charged ions are attracted toward the cathode forming a plasma sheath around the cathode. The ions are accelerated across the sheath and ballistically implanted into the surface of the target where they become incorporated into the solid target material.

Microelectronic fabrication requires that a controlled and uniform number of ions per unit area be implanted across the target to a uniformity of less than or on the order of a 2% standard deviation ($1\sigma$) statistical confidence level. The magnitude of the number of ions implanted is referred to as the ion dose. In PLAD processes, the local ion dose is dependent on the shape of the electric field because the ions will follow a trajectory dictated by the electric field lines. A PLAD system is a very complex and non-linear plasma environment, since the shape of the field lines is governed, at least in part, by applied bias, the geometry of the electrode, the geometry of the anode (including the grounded walls and internal structure of the vacuum vessel surrounding the cathode), materials in the system, plasma parameters, etc. Despite this complexity, a series of assumptions can be used to simplify the analysis required to predict the behavior of the system (doping unifomaity). The plasma sheath thickness defines a critical dimension because it defines the region of highest accelerating potential for imparting sufficient energy to ions to accomplish implantation. Sheath thickness uniformity correlates to dose uniformity via the Child-Langmuir Law. It is assumed that the shape and size of the sheath is generally estimated by the Child-Langmuir Law for space charge limited flow in a quasi-static manner at least while the plasma is present in the PLAD process. This approximation generally holds as long as the process time scales are long compared to ion motion time scales, which dominate sheath behavior. It is further assumed that the plasma sheath will approximately follow vacuum equipotential surfaces across the target surface. It is further assumed that the plasma is uniform across the surface of the target wherein the target and the plasma comprise a configuration having essentially azimuthal symmetry. Such symmetry permits a two dimensional representation of the electric field.

The above assumptions justify the use of two dimensional, cylindrical (R-Z), vacuum potential lines for defining sheath thickness across the target. Sheath thickness uniformity correlates to dose uniformity via the Child-Langmuir Law. In this way it can be numerically predicted that uniformity ought to be improved by creating an electrostatic environment characterized by electric field lines which are flat and uniform across the surface of the target. If the field lines are flat with respect to the scale of the sheath thickness, the sheath can be considered flat. Thus, for a uniform plasma and an azimuthally symmetric system, the ion flux will be uniform across the target.

In order to parameterize dose uniformity, the relationship between sheet resistance and dose is utilized. It is recognized that diffusion limitations at high dopant concentrations will operate to produce an artificially uniform sheet resistance. Despite this limitation, sheet resistance can be used to provide an otherwise adequate characterization of dose uniformity below this limiting region. In particular, contour plots of sheet resistance can be used as a primary indicator of dose uniformity.

Due to complexities implicit in any characterization of this non-linear process, improving PLAD process dose uniformity has conventionally been accomplished by trial and error. Attempts to modify plasma uniformity remotely using magnetic fields have been tried and found to be ineffective. In general, PLAD ion implantation is typically characterized by a radial dose distribution across the target surface having a dramatic nonuniformity near the edge. FIG. 1 shows a representation of the electric field across a wafer-like target 10 mounted atop an electrode 20 in a prior art PLAD configuration. Strong edge effects can be seen in the vicinity of wafer-like target edge 30. The radial distribution typically obtained across the surface of this wafer-like target 10 is easier to see in sheet resistance contour plots characterizing the target surface as shown in FIG. 2. Again, severe edge effects are noted. These edge effects vary with process conditions e.g. applied bias, ambient pressure, etc. In response to this situation, the inventors have developed a numerical model of the process based upon several key assumptions in order to obtain a relatively simple model capable of generally predicting the behavior of this otherwise complex system. Results obtained from this model have led to structural and functional improvements by introducing means for improving the dose uniformity obatinable from PLAD ion implantation processes.

OBJECTS OF THE INVENTION

It is an object of this invention to introduce means for adjusting the shape of the electric field lines and the sheath thickness across the cathode in order to obtain PLAD dose uniformity across the target.

It is a further object of this invention to introduce cost effective means for improving dose uniformity for PLAD ion implantation techniques which are otherwise capable of achieving high dose rates at lower energies for improved microfabrication application.

SUMMARY OF THE INVENTION

A PLAsma Doping (PLAD) ion implantation apparatus is described for obtaining dose uniformity radially across the surface of an ion implantation target wherein the target is disposed upon an electrode, this target preferably has an edge extending thereover. This apparatus employs a separately biasable concentric structure(s) disposed around the electrode in close proximity to the target, preferrably beneath the extended edge of the target. This separately biasable concentric structure(s) is independently yet adjustably biased concurrently with the biasing of the electrode in order to adjust the shape of a plasma electric field induced near the target implantation surface thereby providing a substantially uniform PLAD dose distribution across the target. By preferrably disposing such concentric structure(s) beneath the extended edge of the target, the risk of target sputter contamination is diminished. Applying separate bias to the concentric structure(s) alters the shape of the electric field near the target by changing the effective shape of the cathode and thereby altering the plasma environment e.g. the plasma sheath thickness. Means for accomplishing the biasing of the concentric structure(s) simultaneously with the biasing of the electrode include: voltage dividing the output of a single high voltage pulser, or utilizing correspondingly separate pulsers. Either of which provides means for adjustable bias variation between the electrode and the structure(s) which thereby controls dose uniformity during PLAD ion implantation of the target surface.

BRIEF DESCRIPTION OF THE DRAWINGS

FIG. 4b. is a sheet resistance profile scanned across the diameter of the wafer-like target corresponding to FIG. 4a.

FIG. 5. is a schematic of a configuration for accomplishing PLAD ion implantation in accordance with the invention.

FIG. 7b. is sheet resistance profile scanned across the diameter of the wafer-like target corresponding to FIG. 7a.

DETAILED DESCRIPTION OF THE INVENTION

Figure 1:
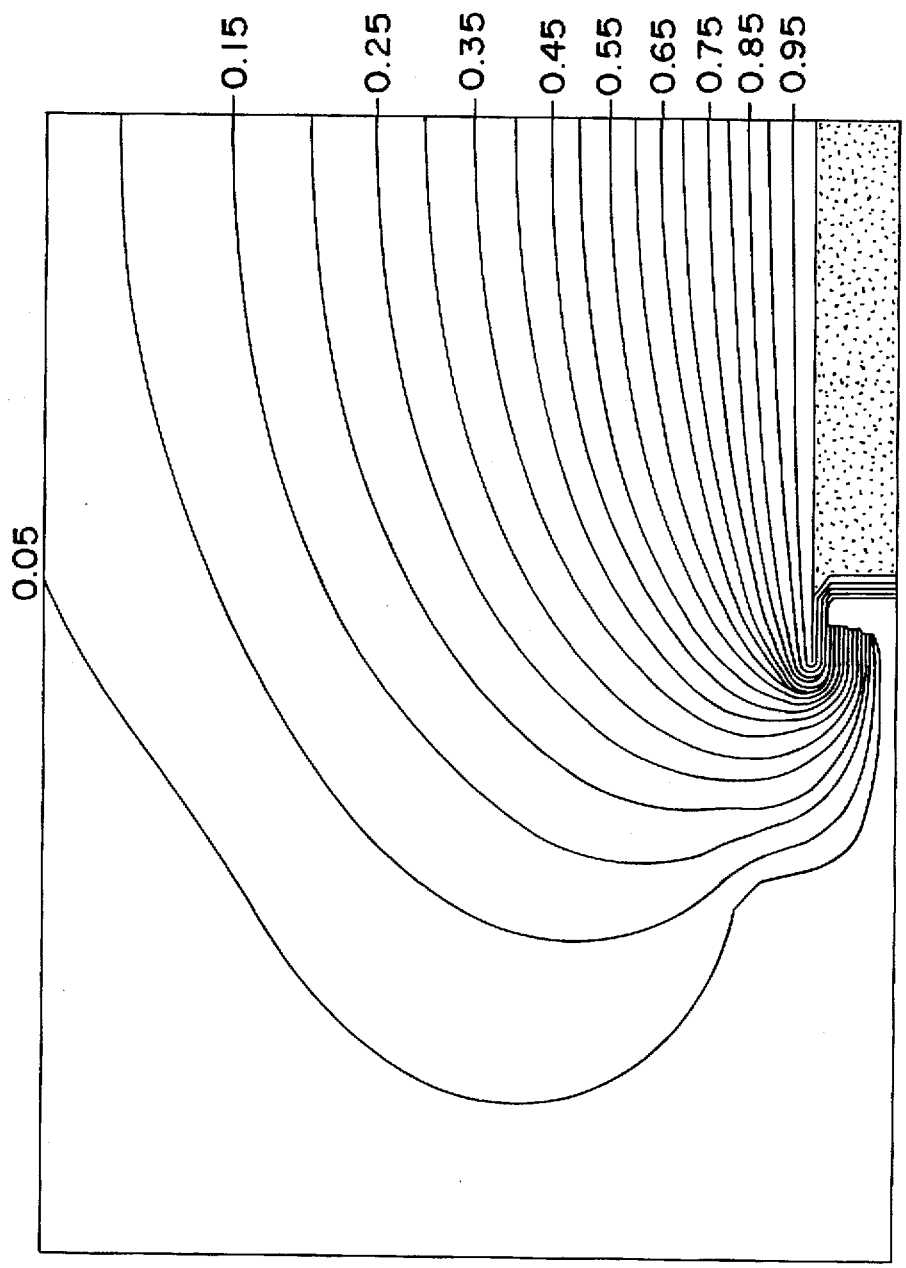
FIG. 1. is a prior art diagrammatic two dimensional representation of the electric field projection as modelled across a wafer-like target disposed upon an electrode illustrating a lack of dose uniformity across the surface of the target.
Figure 2:
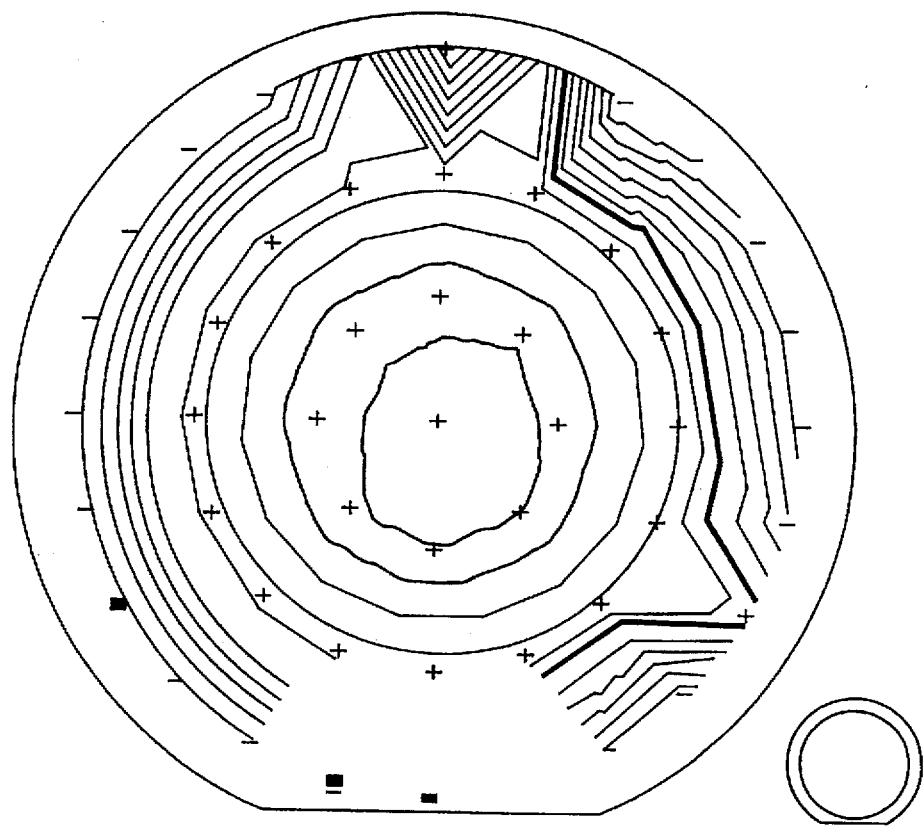
FIG. 2. is a prior art contour plot (2% contour interval) of sheet resistance across the surface of a wafer-like target corresponding to FIG. 1 indicating a predominantly radial distribution of ion dose, with an unacceptable statistical standard deviation of over 10%.
Figure 3:
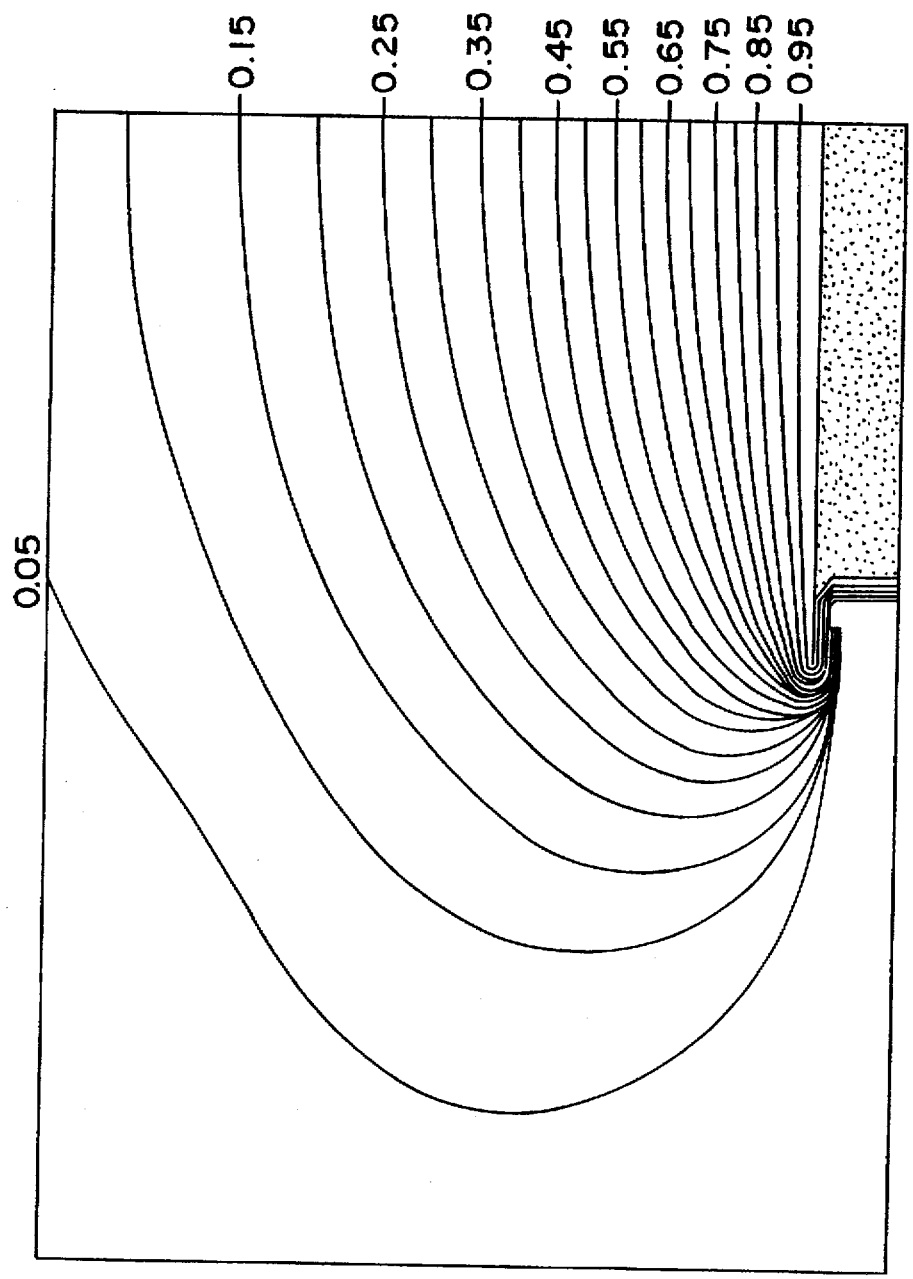
FIG. 3. is a diagrammatic two dimensional representation of the electric field as modelled across a wafer-like target disposed upon an electrode wherein a ring-like structure surrounding the electrode is introduced and grounded.
Figure 4A:
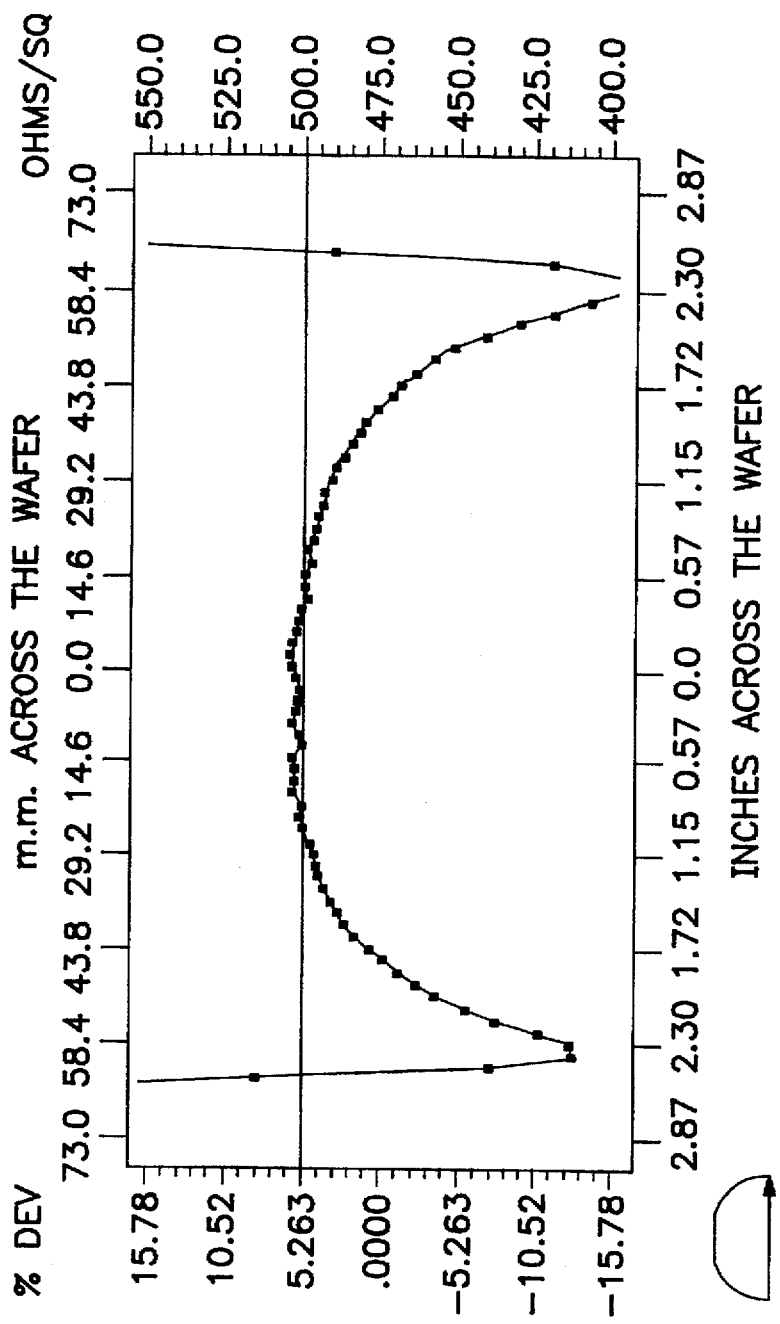
FIG. 4a. is a contour plot (5% contour interval) of sheet resistance across the surface of a wafer-like target corresponding to FIG. 3 indicating a radial ion dose distribution with an unacceptable statistical standard deviation having a 1σ value of 38.5%.
Figure 4B:
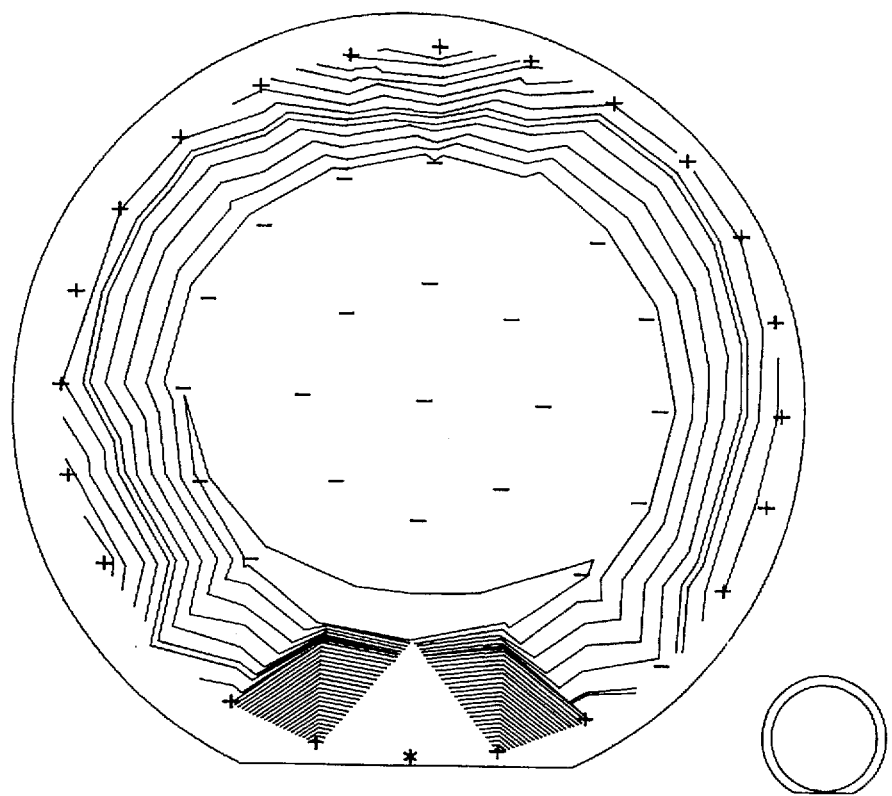

As previously mentioned, a predictive but simplified numerical model has been developed by the inventors with the expectation of identifying potential modifications for improving dose uniformity over a variety of process conditions. As a starting point, modelling of various electrode configuration geometries was conducted. In addition a series of ring structures and ring biases were also modelled including one configuration in which the ring surfaces were grounded in an effort to minimize contamination and sputtering onto the target. A configuration having a grounded ring structure was utilized to validate the numerical model in this limiting case. In the grounding limit, the model predicted an unacceptable result and indeed an unacceptable result was obtained. FIG. 3 indicates the electric field representation predicted from grounding the ring structure introduced and disposed concentric to the electrode and beneath the extended edge of the target. Such grounding also appears to unacceptably intensify edge effects. FIG. 4a is a contour plot (5% contour interval) of sheet resistance corresponding to the target surface in the configuration of FIG. 3, i.e. the grounded ring structure. As predicted, a dose distribution having an unacceptable statistical standard deviation (i.e. a 1σ value of 38.5%) is obtained in FIG. 4a. However, by realistically predicting this limiting case (i.e. the grounding of the ring structure); these results appear to indicate that the assumptions made in development of the simplified numerical model are valid.

In accordance with the invention, as shown in FIG. 5, a separately biasable ring structure, preferably made of a low sputter coefficient material which is chemically inert to the plasma, is disposed around the cathode and preferrably beneath the edge of the wafer-like target in order to fine tune the shape of the plasma induced electric field, with less risk of sputter contamination. Note ring structure 40 is shown separately biased at 50 from electrode 60 which is separately biased at 70. Wafer-like target 80 is shown disposed upon electrode 60 having an extended edge portion 90. Ring structure 40 is disposed concentrically about electrode 60 and sufficiently close to the target preferrably disposed beneath edge portion 90. In operation, biases 50 and 70 are separately adjustable but concurrently applied being generated by voltage dividing the output of a single high voltage pulser (not shown) or alternatively generated by correspondingly separate pulsers (herein shown as two square wave pulses). Fine tuning is provided by adjusting bias ratios between ring structure 40 and the electrode 60.

Figure 6:
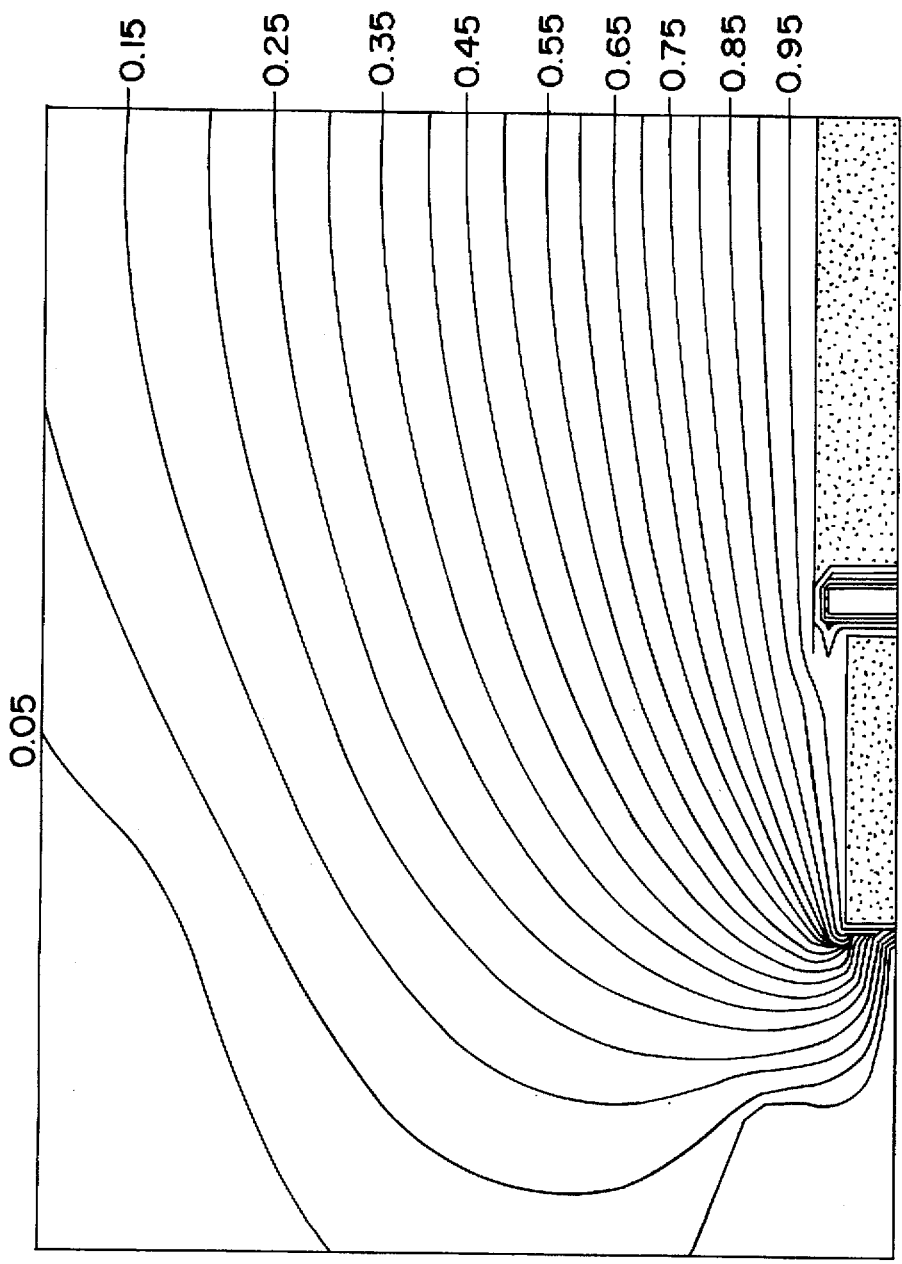
FIG. 6. is a diagrammatic two dimensional representation of the electric field as modelled across a wafer-like target disposed upon an electrode corresponding to the configuration of FIG. 5 wherein a ring-like structure is introduced surrounding the electrode and separately biased in accordance with the invention.

The results of separately biasing the PLAD ion implant configuraion illustrated in FIG. 5 are shown in the 2d electric field representation of FIG. 6 where it can be seen that edge effects have been dramatically diminished. Similarly, FIG.

Figure 7A:
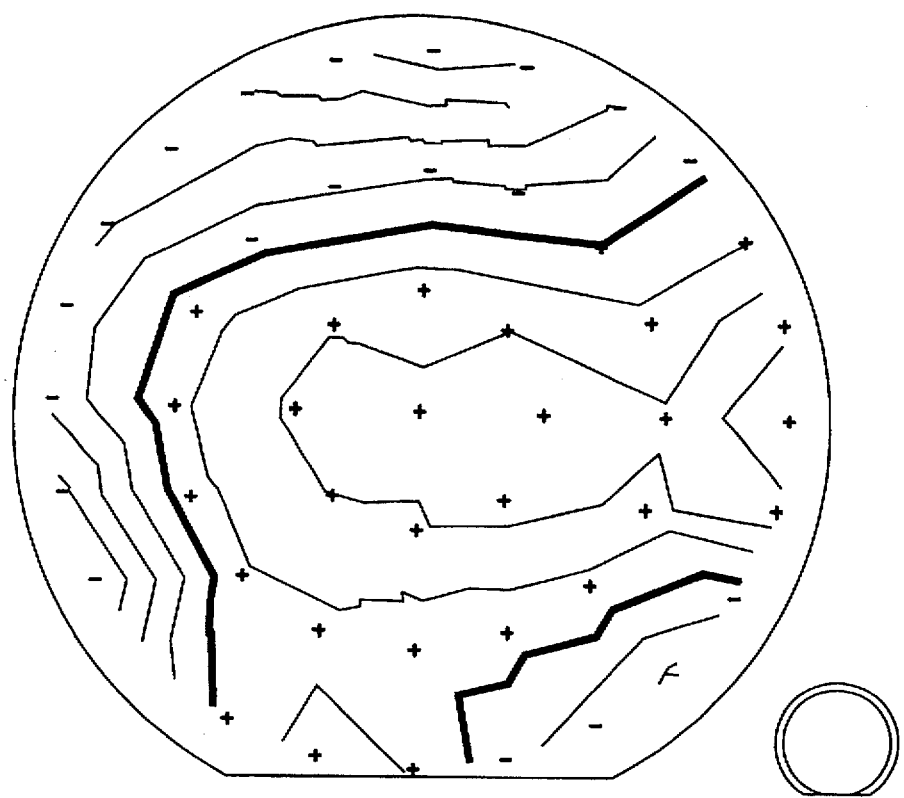
FIG. 7a. is a contour plot (1% contour intervals) of sheet resistance across the surface of a wafer-like target corresponding to FIG. 6 with an unacceptable statistical standard deviation having a 1σ value of 2.17% showing dramatically improved dose uniformity across the surface of the target.
Figure 7B:
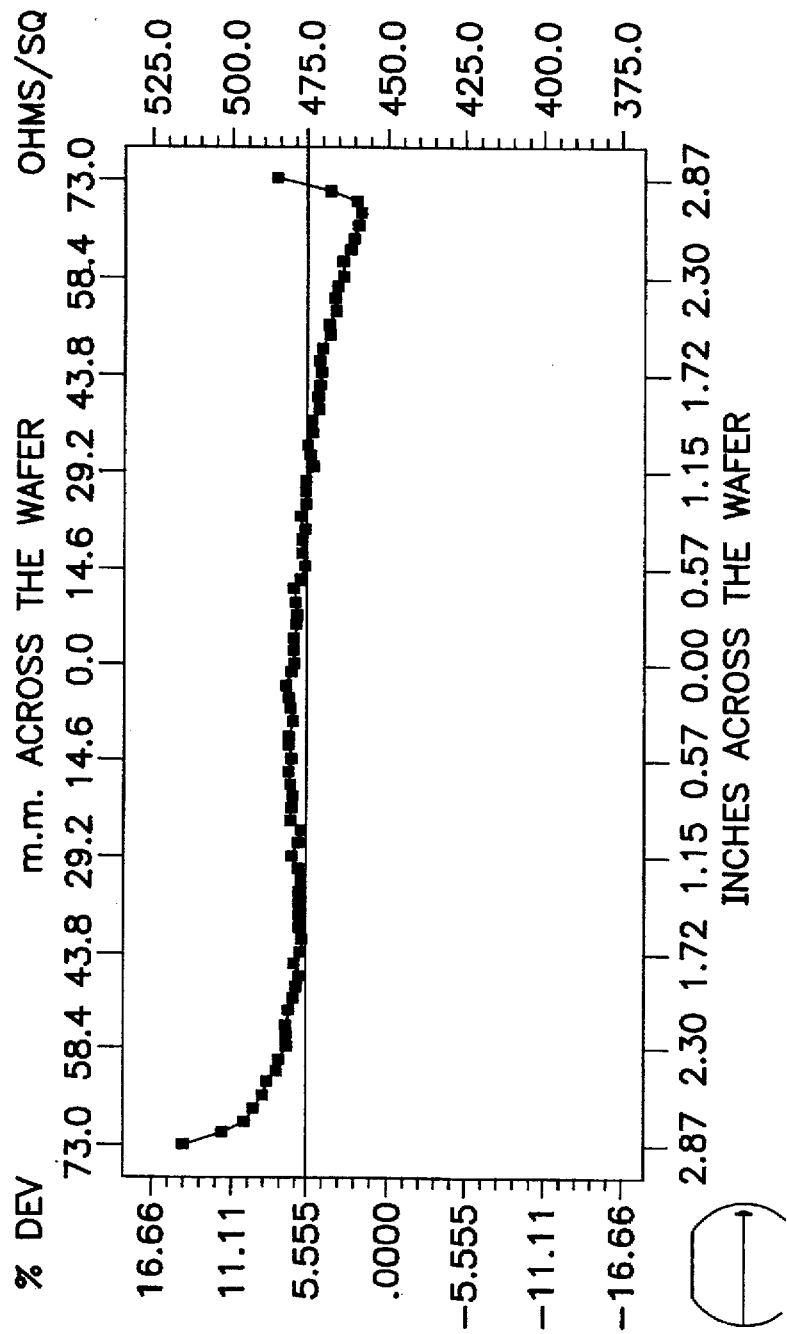

7a shows a contour plot of sheet resistance across the surface of a wafer-like target corresponding to the PLAD ion implantation configuration of FIG. 5; wherein improved overall dose uniformity is obtained. Indeed, in FIGS. 7a and 7b, the sheet resistance across the wafer-like target shows acceptable dose uniformity with minimal edge effects, accomplished in accordance with the introduction of a ring-like structure(s) which can be separately biased for providing adjustable control of the electric field and plasma sheath thickness of the cathode thereby providing dose uniformity of the dopant being implanted.

In the initial embodiment of this invention aluminum was used as the material for constructing the ring structure. Aluminum is clearly not the optimum material for the ring as the high sputter yield of aluminum at these biases and the high secondary electron emission coefficient can cause serious problems. However, aluminum was inexpensive, easy to work with, and otherwise a suitable material for establishing a proof of principle in the reduction to practice of this invention. Materials such as amorphous silicon, silicon, amorphous carbon, pure carbon, nickel and nickel clad materials might better be utilized for the ring structure material. Indeed a low sputtering coefficient conductor which is chemically inert to the plasma species would be preferrable. The results typified in FIG. 6, 7a and 7b indicate that when a ring structure which is not physically or electrically connected to the wafer-like target and electrode, is introduced and disposed as described herein, it is possible to separately bias these two structures in order to fine tune the shape of the field as well as the plasma sheath thereby providing dose uniformity in PLAD ion implantation processes.

It is understood that the present invention is not limited to any particular embodiment set forth herein and can embrace all such modifications which come within the scope of the following claims.

What is claimed is:

1. Apparatus for accomplishing PLAsma Doping (PLAD) ion implantation comprising:

an electrode enclosed in a vacuum chamber;

a target disposed upon said electrode;

means for maintaining a plasma having dopant ions at an implantation surface of said target;

a concentric structure of suitably conductive material being electrically isolated from said target bearing electrode and disposed so as to surround said electrode while being sufficiently close to said target; and means for separately biasing said electrode concurrently with said concentric structure in order to provide adjustable bias variation between said electrode and said structure capable of providing dose uniformity during said PLAD ion implantation of said target.

2. Apparatus in accordance with claim 1 wherein said target is a wafer having an edge region extending over said electrode so that said concentric structure is disposed beneath said wafer edge region.

3. Apparatus in accordance with claim 1 wherein said means for separately biasing further comprises:

a pulser having a voltage divider in order to bias said electrode concurrently with said concentric structure.

4. Appartus in accordance with claim 1 wherein said means for separately biasing further comprises:

separate pulsers for concurrently biasing said electrode and said concentric structure.

5. Apparatus in accordance with claim 1 wherein said means for separately biasing further comprises:

a means for controlling said adjustable bias variation between said electrode and said structure in order to adjust dose distribution during said PLAD ion implantation of said target surface.

6. Apparatus in accordance with claim 1 wherein said concentric structure further comprises:

a plurality of components said components being separately biasable in order to fine tune bias adjustment between said electrode and said corresponding components of said structure in order to provide further adjustability of dose distribution.

7. Apparatus in accordance with claim 1 wherein said conductive material is a low sputtering coefficient material which is chemically inert to said plasma species.

8. Apparatus in accordance with claim 1 wherein said conductive material includes silicon, carbon, or nickel/nickel clad materials.

* * * * *